(12) United States Patent
Yang et al.

(10) Patent No.: US 7,499,557 B1
(45) Date of Patent: Mar. 3, 2009

(54) DRIVING METHOD OF SPEAKER AND THE DRIVING CIRCUIT THEREOF

(75) Inventors: Brian Yang, Hsinchu (TW); Kuo-hsiang Chen, Hsinchu (TW); Fu-yuan Cheng, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/399,729

(22) Filed: Sep. 20, 1999

(51) Int. Cl.
*H04R 3/00* (2006.01)
(52) U.S. Cl. .......................... 381/111; 330/10
(58) Field of Classification Search ............... 381/111, 381/117, 116, 120; 341/152, 144, 145, 153; 700/94; 330/10
See application file for complete search history.

(56) References Cited

U.S. PATENT DOCUMENTS 5,764,173 A * 6/1998 Flynn .......................... 341/152
6,014,055 A * 1/2000 Chester ....................... 330/10

\* cited by examiner

*Primary Examiner*—Ping Lee
(74) *Attorney, Agent, or Firm*—Bacon & Thomas, PLLC (57) ABSTRACT

The present invention relates to a driving method of speaker and the driving circuit thereof by employing the technique of converting digital sound signals into corresponding driving signals to drive the speaker. The driving method of the speaker comprises the steps of dividing the digital sound data into higher bits data group and lower bits data group, converting one data group into driving signals represented as pulse height, and modulating the other data group into driving signals represented as pulse width. The driving circuit comprises pulse width modulation (PWM) circuit for modulating one data group into driving signals represented as pulse width and digital analog conversion circuit for converting the other data group into driving signals represented as pulse height.

33 Claims, 6 Drawing Sheets

DRIVING METHOD OF SPEAKER AND THE DRIVING CIRCUIT THEREOF

BACKGROUND OF THE INVENTION

A. Technical Field of the Invention

The present invention relates to a driving method of speaker, and in particular, to a driving method and a driving circuit of speaker by the application of both pulse width modulation (PWM) and digital to analog converter (DAC) technique.

B. Description of the Prior Art

Digital sound playing is an important function of consumer electronic products. Generally, there are two basic types of driving method of outputting digital sound via speaker, i.e., digital to analog converter driving method and pulse width modulation driving method.

Figure 1:
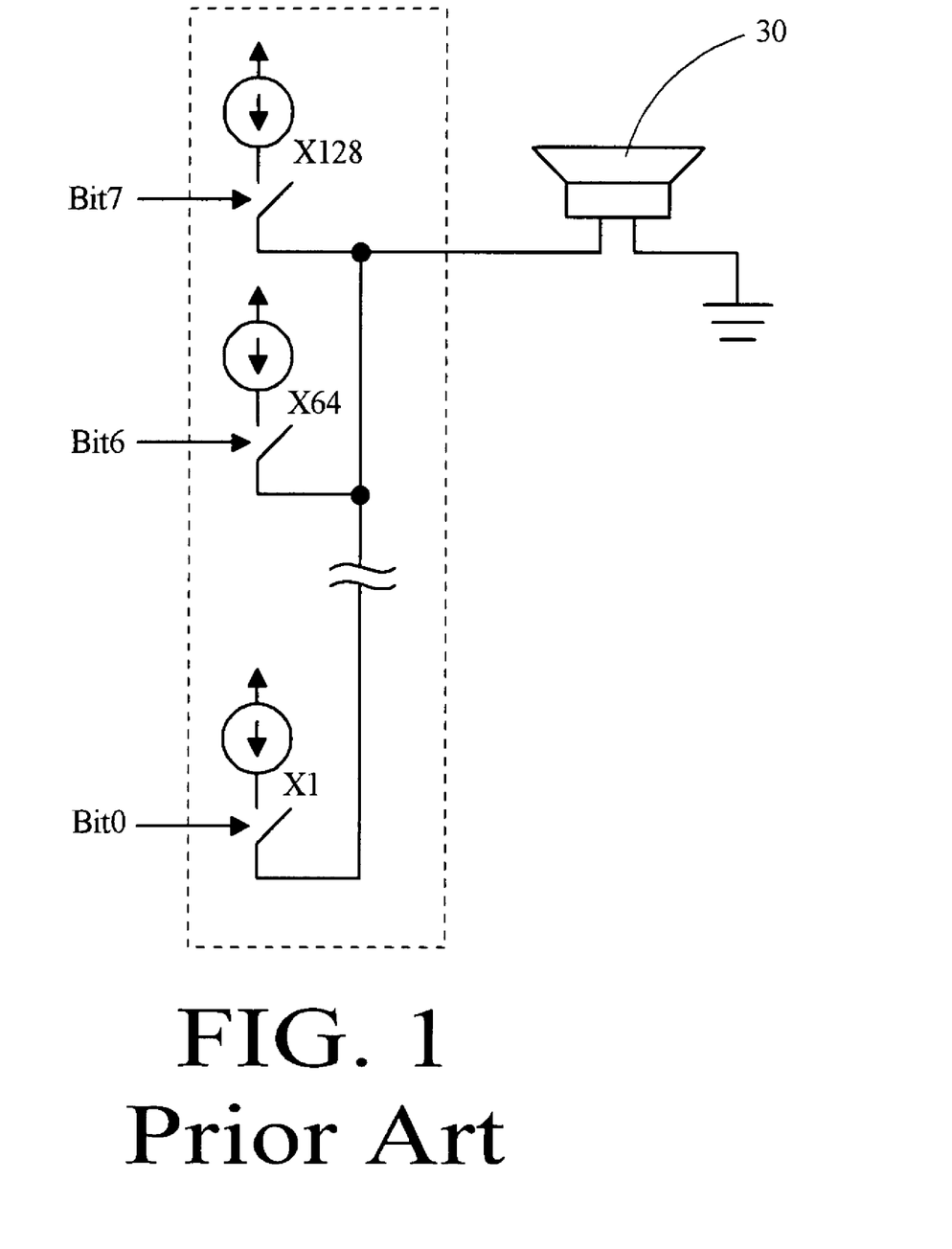
FIG. 1 is a circuit diagram of a conventional DAC driving structure.

FIG. 1 illustrates a circuit diagram of traditional DAC. In this driving method, digital sound data are converted into analog signals with responding current value, and then these analog signals are directly drive the speaker. As shown in FIG. 1, each bit of digital sound data, Bit 0~Bit 7, is used to control a corresponding current amplifier with different current ratio, and the output of each current amplifier are commonly connected to the speaker. During playing, digital sound data are sequentially input to the DAC with the speed of sampling rate. In integrated circuit design, each current amplifier and control switch can be implemented by MOS elements with different area.

Figure 2:
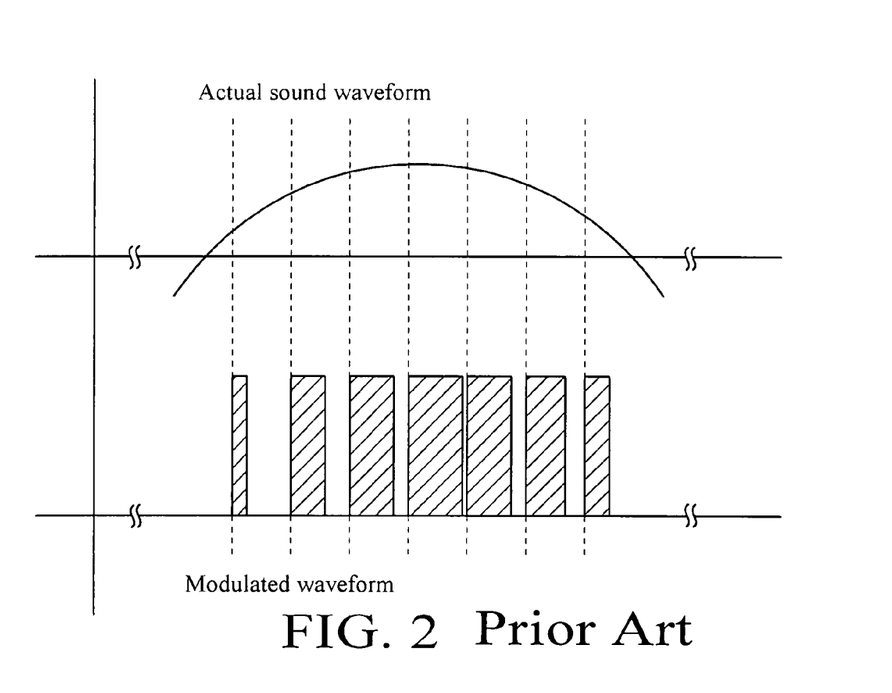
FIG. 2 is a waveform modulated by a conventional PWM driving structure.
Figure 3:
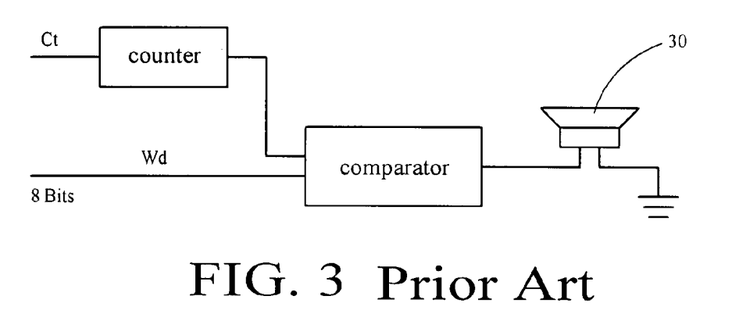
FIG. 3 is a circuit diagram of a conventional PWM driving structure.

FIGS. 2 and 3 illustrate the waveform modulated by PWM and its implementation structure. The action principle of PWM is to modulate sound amplitude onto pulse width, not onto pulse height. When the modulation pulse frequency is far higher than the sound frequency, the sound amplitude can be represented by pulse width and drive a speaker. Assume the PWM is implemented digitally and the amplitude, pulse width are equally divided into 255 parts, i.e. represented as $2^8$, then the sound amplitude is 255 level, and pulse width is also represented by 255 level in the PWM. The waveform modulated by PWM is shown in FIG. 2 and its block diagrams are shown in FIG. 3. The action principle is that digital sound data Wd and the output of a counter are input to a comparator at the same time. At the beginning of every sampling pulse, digital sound data Wd is input to the comparator and the counter starts to count. At this instance, the output of the comparator is HI. When the count value reaches the value of Wd, the output of the comparator is become LOW. Thus, the waveform of FIG. 2 is obtained.

Under this principle of PWM, the sound amplitude is represented by pulse width, and the pulse width is determined by the counting of a counter. Thus, the linearity of the sound driving signals are determined by the counter, and the clock pulse of the counter is provided by the quartz oscillator. Because the accuracy of quartz oscillator is high, thus, the advantage of PWM is that the linearity of the sound driving signals is good and the quality of sound can be easily controlled. In addition, the factors determining the sound quality for this sound driving method are as follows.

1) Modulation frequency; and
2) Sound resolution.

If the modulation frequency is too low, aliasing phenomenon will affect the sound quality. Thus, in the application of PWM, the modulation frequency has to be fixed. If the reference clock pulse in PWM is 4 MHz, the acceptable lowest modulation frequency is assumed to be F Hz, then the sound level is 4M/F (integer). If the reference clock pulse in PWM becomes to 2 MHz, then the sound level is lowered to 2M/F, which lowers the sound resolution, and the sound quality becomes poor. Thus, in the application of PWM, in order to achieve a specific sound quality, one basic requirement is the higher speed clock pulse.

However, the advantage of the DAC driving method is that the required clock pulse is equal to the sampling rate of sound signals, thus, the requirement of clock pulse is low. But the drawback is that the linearity of the amplifier is lowered while the required playing sound is large and the output current of each current amplifier is large. Thus, loss of fidelity of sound is occurred. In the PWM driving method, because sound amplitude is represented by pulse width and the pulse width is determined by the counting of the counter, the linearity of sound is determined by the counter. As the linearity of the sound is determined by the counter, and the clock pulse of the counter is provided by the quartz oscillator with great accuracy, the linearity of the sound driving signals are good and the quality of sound can be easily controlled. The only drawback is that a higher speed clock pulse is required.

SUMMARY OF THE INVENTION

The object of the present invention is to provide a driving method of speaker and the driving circuit thereof, wherein the driving signals are obtained by both PWM driving method and DAC driving method. It has the advantage of good linearity and the characteristics of low clock pulse in combination with DAC in improving the PWM at higher speed pulse. In accordance with the present invention, the method comprises the following steps:

1) dividing each digital sound data into two groups, i.e., higher bits data group and lower bits data group;

2) modulating one data group into driving signals represented by pulse width, i.e. this data group is modulated by PWM principle; and 3) converting the other data group into driving signals represented by pulse height, i.e., this data group is converted by DAC principle.

As a portion of digital sound data is converted by DAC, the clock pulse frequency required by PWM will be lowered accordingly, but the resolution of sound can be still maintained.

These and other aspects of the invention will be apparent from the elucidated with reference to the embodiments described hereinafter.

DETAILED DESCRIPTION OF THE PRESENT INVENTION

In accordance with the present invention, the driving method of speaker is first to divide digital sound data into two groups, i.e., higher bits data group and lower bits data group. One data group is converted by DAC method, and the other data group is modulated by PWM method so as to obtain the advantages of the low pulse frequency of DAC method and the good linearity of PWM method. There is no restriction to the implementation method of higher bits data either by DAC method or by PWM method.

Figure 4:
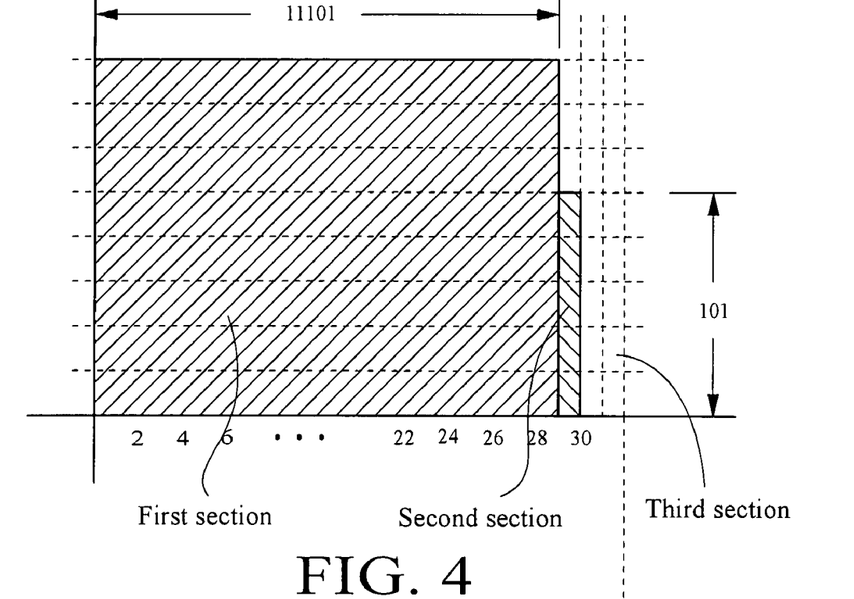
FIG. 4 is a driving waveform modulated by the driving method of speaker of the present invention.
Figure 5:
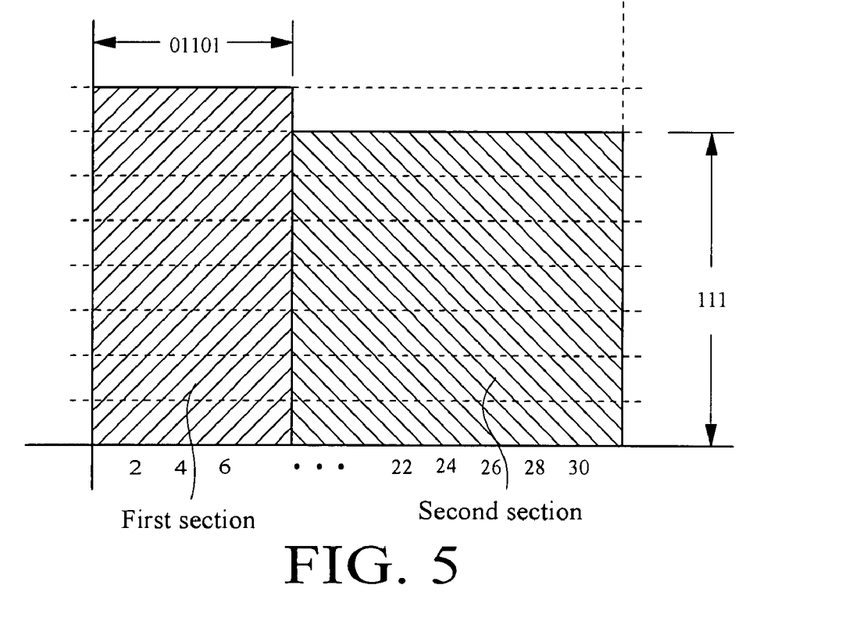
FIG. 5 is another driving waveform modulated by the driving method of speaker of the present invention.

In order to further understand the present invention, assume the digital sound data is 8 bits. The 8 bits data are divided into a data group with P bits data and the other group with D bits data. In this embodiment, the P is defined as 5 and regarded as pulse width resolution data and the D is defined as 3 and regarded as pulse heigh resolution data. FIGS. 4 and 5 show the waveform obtained by present invention for the digital sound data "11101101", wherein the P bits data group is higher bits data in FIG. 4, and P bits data group is lower bits data in FIG. 5.

Figure 6:
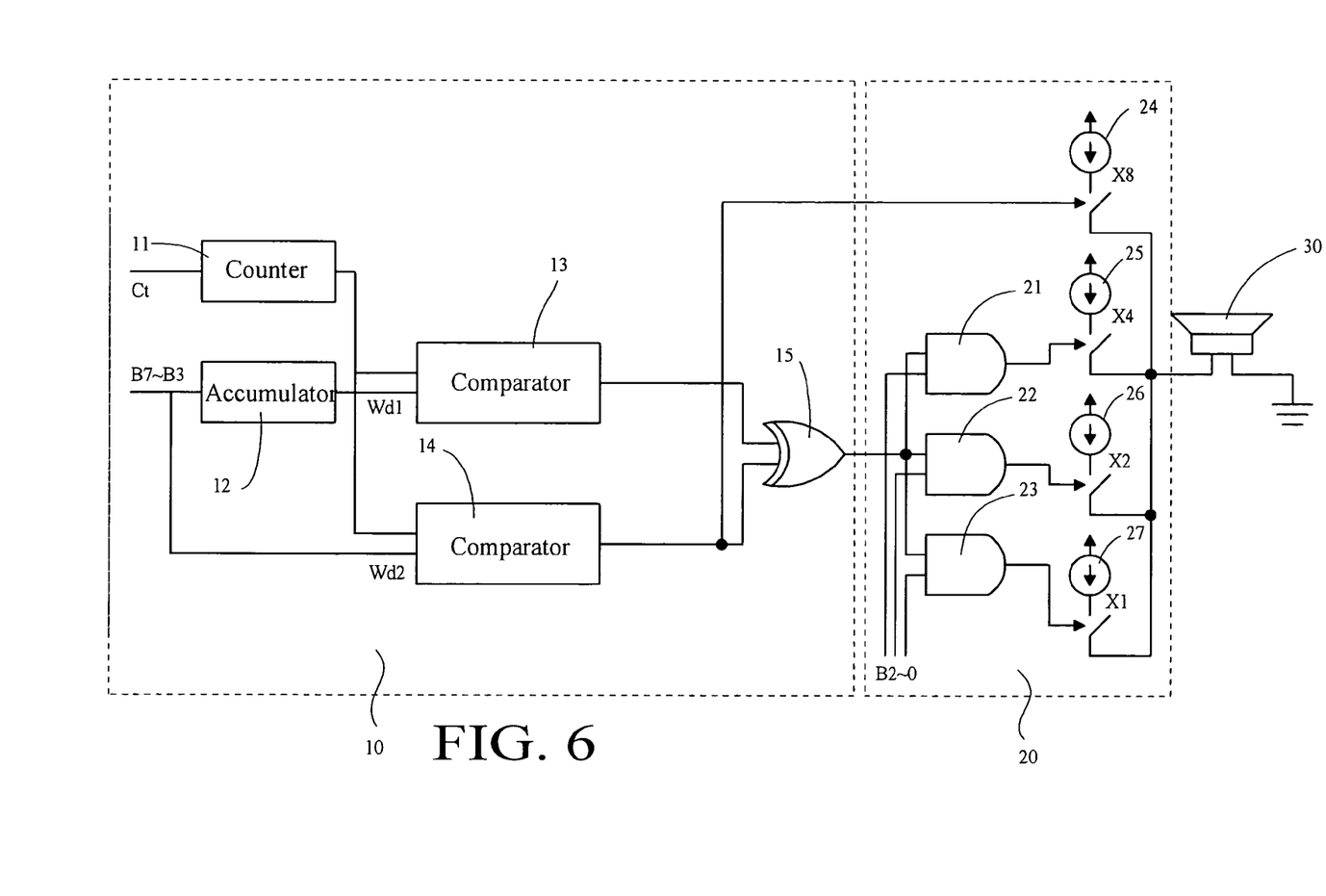
FIG. 6 is a circuit diagram according to the driving method of speaker of the present invention.

Next, referring to FIG. 6, there is shown the first embodiment circuit structure of the driving method of the present invention. As shown in this drawing, the circuit comprises PWM modulation circuit 10, DAC convert circuit 20, and speaker 30. The PWM modulation circuit 10 modulates P bits data into driving signals represented by pulse width, and DAC convert circuit 20 converts D bits data into driving signals represented by pulse height.

The PWM modulation circuit 10 comprises a counter 11, an accumulator 12, a first and second comparator 13, 14 and a XOR gate 15. The accumulator 12 receives the P bits data and adds 1 as its output. The first comparator 13 compares the counting value of the counter 11 with the output value of the accumulator 12 and outputs HI if the output value of the accumulator 12 is smaller than the counting value of the counter 11. The second comparator 14 compares the counting value of the counter 111 with the P bits data and outputs HI if the P bits data is smaller than the counting value of the counter 11. The XOR gate 15 receives the output of the first comparator 13 and the second comparator 14. In FIG. 6, Wd1 is the output value of accumulator 12 and Wd2 is the value of P bits data, B7-B3.

The DAC convert circuit 20 comprises three AND gates 21, 22, 23 and four current sources 24, 25, 26 and 27. One of the input terminal of each AND gate 21, 22, 23 connects to the D bits data, respectively, and the other input terminal is commonly connected to the output of the XOR gate 15. The four current sources 24, 25, 26, 27 have different current ratio, for example 8, 4, 2 and 1, and are controlled by the output of the second comparator 14 and the three AND gates 21, 22, 23, respectively. The output of each current source 24, 25, 26 and 27 are commonly connected to the speaker 30.

As shown in FIG. 4, the pulse width is $32(2^5)$ level, and the pulse height is $8(2^3)$ level. At the beginning of sampling pulse, P bits data, B7-B3 are input to the second comparator 14 and the accumulator 12. When Wd1, Wd2 are smaller than the counting value of the counter 11, the output of the first comparator 13 and the second comparator 14 is HI. When Wd1, Wd2 are greater or equal to the counting value of the counter 11, the output of the first comparator 13 and the second comparator 14 is LOW. Referring to FIG. 6, there is shown the circuit structure. The action of the circuit is divided into three stages.

The first stage is that Wd1 and Wd2 is smaller than the counting value of the counter 11. At this stage, the output of the first and the second comparator 13, 14 are HI. Thus, the output of XOR gate is LOW. At this instance, the output of the three AND gates 21, 22, 23 connected to the XOR gate 15 is LOW, thus, the current sources 25, 26, 27 are OFF, but the current source 24 connected to the second comparator 14 is ON. Thus the pulse height of the driving signal at this stage is at level 8 and the pulse width is equal to Wd2 reference clock, illustrated by the first section of the waveform of FIG. 4.

The second stage is that Wd2 is equal to the counting value of the counter 11, but Wd1 is smaller than the counting value of the counter 11. At this stage, the output of the second comparator 14 is LOW, but the output of the first comparator 13 is HI, thus the output of XOR gate 15 is HI. At this instance, the current source 24 connected to the second comparator 14 is OFF, but the outputs of the other three AND gates 21, 22, 23 are dependent on the D bits data, B2-B0. As D bits data B2-B0 is "101", the output of AND gates 21, 23 is is HI, and output of the AND gate 22 is LOW. Thus, the pulse height of the driving signals at this stage is at level 5 and the pulse width is equal to one reference clock, illustrated by the second portion of the waveform of FIG. 4.

The third stage is that Wd1 and Wd2 are greater than or equal to the counting value of the counter 11. At this stage, because the output of the first and the second comparator 13, 14 are LOW, the output of XOR gate 15 is LOW. Thus, the output of the three AND gates 21, 22, 23 connected to the XOR gate 15 are also LOW. At this instance, the four current sources 24, 25, 26, 27 are OFF. Thus, the pulse height of the driving signals at this stage is at level 0, illustrated by the third portion of the waveform of FIG. 4.

shown in FIG. 6, the circuit structure employs five higher bits data as PWM control, thus, the waveform of the driving signals has a waveform similar to the conventional PWM waveform. However, the difference is that three lower bits data are converted into driving signals by DAC with one reference clock width, such that the pulse level of PWM is lowered and the reference clock frequency is also lowered at the same time.

Figure 7:
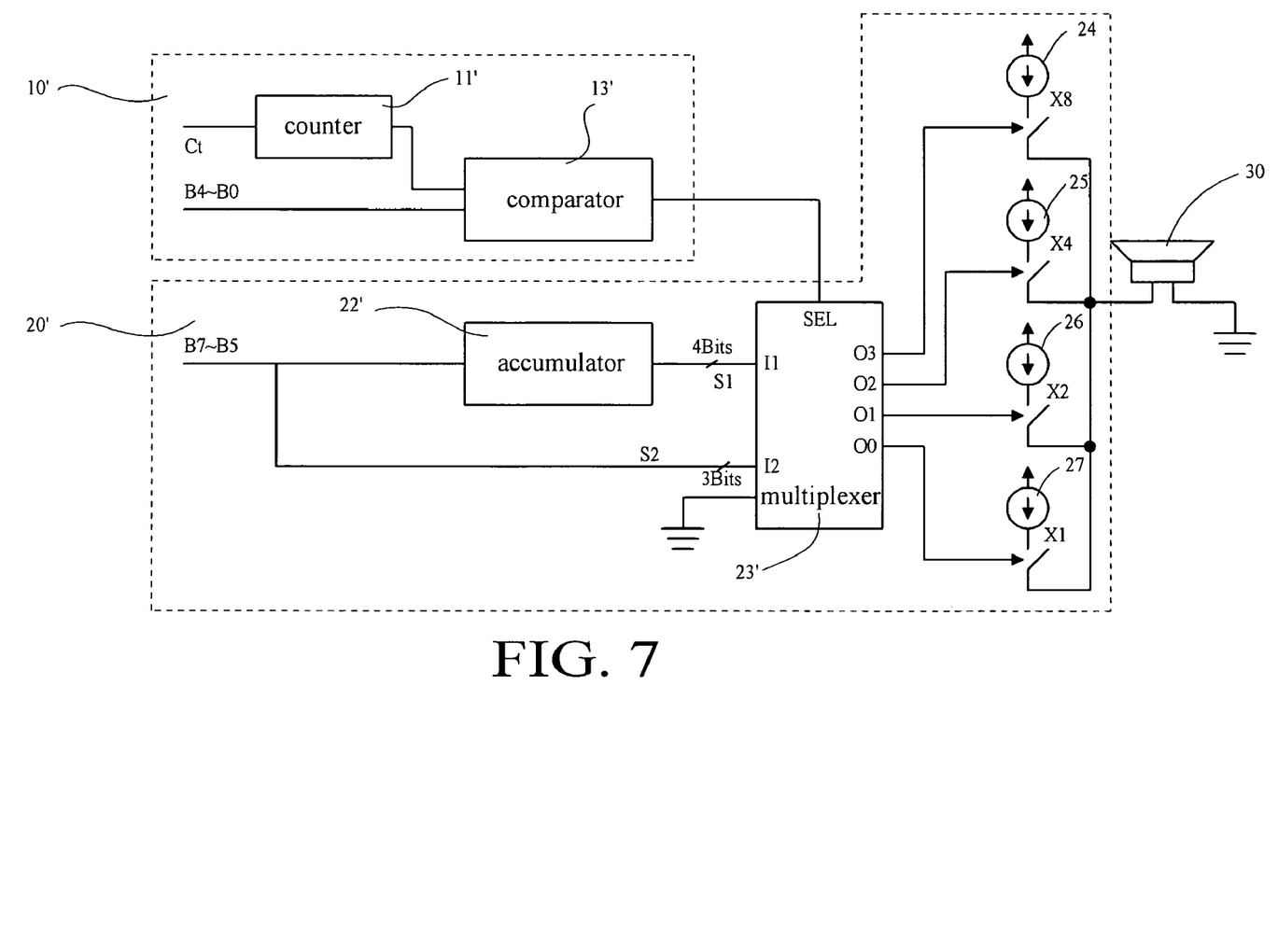
FIG. 7 is another circuit diagram according to the driving method of speaker of the present invention.

Next, referring to FIG. 7, another embodiment of circuit structure according to the driving method of the present invention is illustrated. The circuit structure employs three higher bits data (B7-B5) as the D bits data to proceed with pulse height conversion, and employs other five lower bits data (B4-B0) as P bits data to proceed with pulse width modulation. As shown in this drawing, the circuit structure comprises PWM modulation circuit 10', DAC convert circuit 20', and speaker 30.

The PWM modulation circuit 10' is similar to the conventional PWM modulation circuit, comprises a counter 11' and a comparator 13' connected to the output of the counter 11' and the P bits data.

The DAC modulation circuit 20' comprises an accumulator 22' and a multiplexer 23'. The accumulator 22' receives D bits data and adds 1 as the output and the output of the accumulator 22' is 4 bits, D+1. The multiplexer 23' is a 2 to 1, 4-bits multiplexer. The multiplexer 23' receives the output of the accumulator 22' and the D bits data S2 as two inputs 11, 12 and receives the output of the comparator 13 as selection signal SEL. Because S2 is a 3-bits data, the highest bit of the input terminal 12 of the multiplexer 23' must be directly connected to the ground. In addition, the output of the multiplexer 23' respectively controls 4 current sources 24, 25, 26 and 27 with different current ratio. The output of these current sources 24, 25, 26, 27 are commonly connected to the speaker 30.

Next, referring to FIG. 7, describe the action of the circuit structure in accordance with the present invention. The action is divided into two stages.

The first stage is that the value of P bits data (B4-B0) is smaller than the counting value of the counter 11'. At this stage, the output of the comparator 13' is LOW. Thus, the multiplexer 23' selects the S1 as the output. As the data of S1 is greater than D bits data with 1, it indicates that the pulse height of driving signal is higher than the D bits data by one level. And the pulse width of driving signal is the width represented by P bits data, illustrated by the first section of the waveform of FIG. 5.

The second stage is that the value of P bits data (B4-B0) is greater than or equal to the counting value of the counter 11'. At this stage, the output of the comparator 13' is HI, thus the multiplexer 23' selects the S2 as the output. At this instance, the pulse height of driving signal is equal to the value of D bits data and maintains to the end of this cycle, illustrated by the second portion of FIG. 5.

As shown in FIG. 7, the circuit structure employs higher bits data as the DAC control. Thus, the output waveform of the driving signal is similar the conventional DAC waveform and the difference is that the five lower bits data are modulated by PWM. Thus, the number of current source of different current ratios can be reduced.

Figure 8:
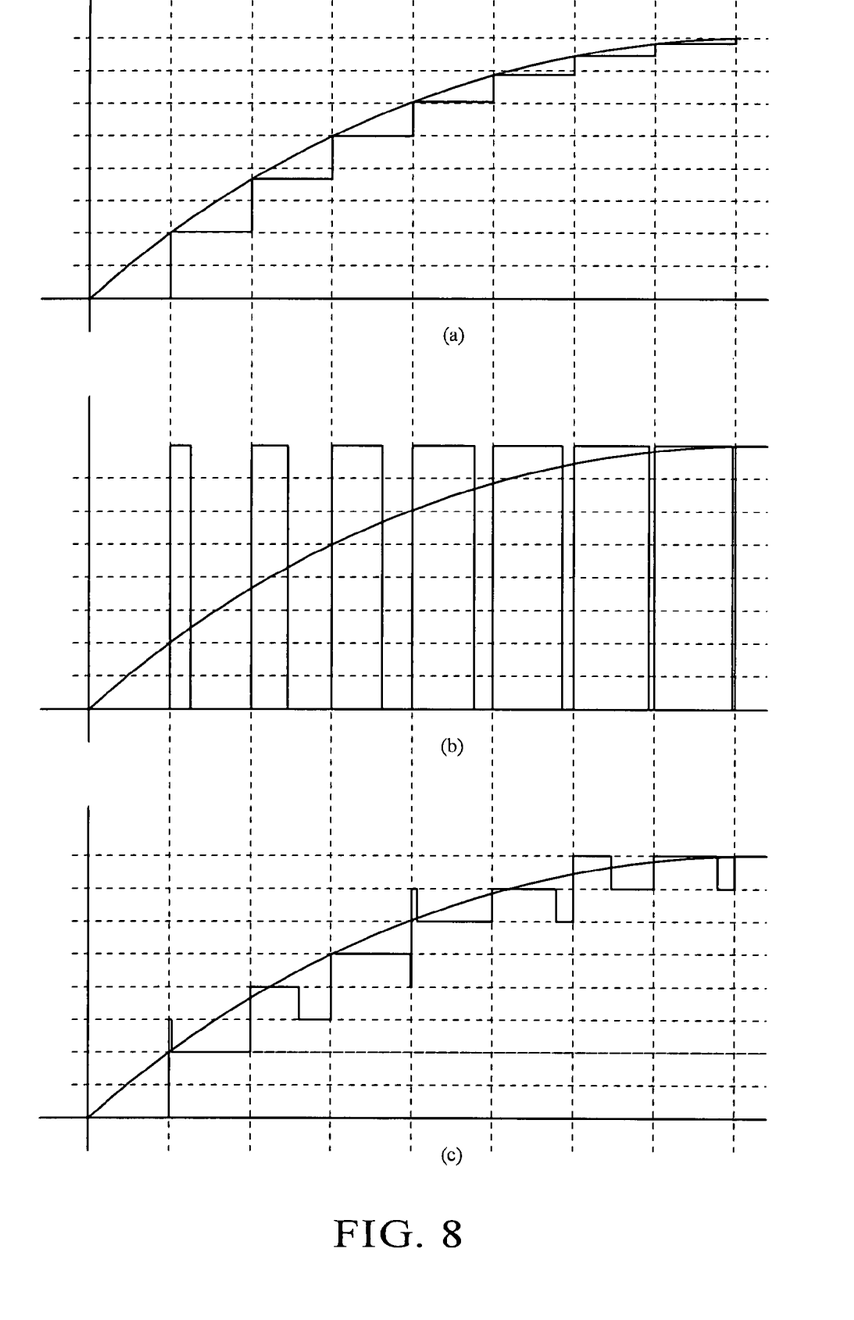
FIG. 8 shows the waveforms of driving signals obtained by the DAC, PWM, and in accordance with the driving method of the present invention, respectively.

FIG. 8 shows the waveforms of driving signals obtained by the DAC, PWM and present driving method, respectively. FIG. 8(*a*) is the waveform produced by DAC. FIG. 8 (*b*) is the waveform produced by PWM. FIG. 8(*c*) is the waveform obtained by the driving method of the present invention, modulated based on the circuit of FIG. 7, using D bit as higher bit. As shown in the drawings, each pulse width of the speaker driving waveform, produced by DAC, is of the sane; each pulse height of the speaker driving waveform, produced by PWM, is of the same; but in accordance with the present invention, the waveform obtained has different heights and widths.

The driving method of speaker of the present invention divides digital sound data into two groups; one group with bits data being modulated by PWM, the other group with bits data being converted by DAC. Since the number of bits modulated by PWM is reduced, the pulse width level is also reduced. Thus, the frequency of reference clock frequency is relatively low which solves the needs of higher speed clock for PWM. Besides, the number of bits for DAC conversion is also reduced, and the scope of current source variation is narrow which can be controlled within the range of linear variation. Thus, the problems encountered in non-linear DAC are solved.

While the invention has been shown typical preferred embodiments of the invention, it should be apparent to those skilled in the art that is not so limited but is susceptible to various changes without departing from the scope of the invention. For instance, the PWM, in the present invention, is used to modulate 5 bits data, and DAC is used to convert 3 bits data, but PWM can be used to modulate 4 bits data and DAC is used to convert 4 bits data.

What is claimed is:

1. A driving method of speaker for converting digital sound data into corresponding driving signals to drive said speaker, the driving method comprising the steps of:
    dividing said digital sound data into at least two data groups, including a first data group and a second data group;
    modulating said first data group into a first driving signal, wherein the magnitude of said first data group is represented by pulse width of said first driving signal;
    converting said second data group into a second driving signal according to said second data group and under the control of a second input signal based on said first driving signal, wherein the magnitude of said second data group is represented by pulse height of said second driving signal;
    outputting a speaker driving signal according to at least said first driving signal and said second driving signal; and
    driving said speaker according to said speaker driving signal.

2. The driving method as set forth in claim 1, wherein said first data group is higher bits data group and said second data group is lower bits data group.

3. The driving method as set forth in claim 1, wherein said first data group is lower bits data group and said second data group is higher bits data group.

4. A driving circuit of speaker for converting digital sound data into corresponding driving signals to drive said speaker, said digital sound data being divided into at least two data groups including a first data group and a second data group, the driving circuit comprising:
    a pulse width modulation circuit being used to modulate said first data group into a first driving signal, wherein the magnitude of said first data group is represented by pulse width of said first driving signal; and
    a pulse height conversion circuit being used to convert said second data group into a second driving signal according to said second data group and under the control of a second input signal based on said first driving signal, and to output a speaker driving signal according to at least said first driving signal and said second driving signal, wherein the magnitude of said second data group is represented by pulse height of said second driving signal;
    wherein said speaker is driven according to said speaker driving signal.

5. The driving circuit of speaker as set forth in claim 4, wherein the pulse width modulation circuit comprises:
    a counter;
    an accumulator having one input terminal connected to said first data group;
    a first comparator for comparing the output of said counter with the output of said accumulator;
    a second comparator for comparing the output of the counter with the first data group; and
    a XOR gate having two input terminals being connected to the outputs of said first comparator and the second comparator, respectively.

6. The driving circuit of speaker as set forth in claim 5, wherein the counter starts counting from 0 at the beginning of every sound sampling cycle.

7. The driving circuit of speaker as set forth in claim 5, wherein the output of the first comparator is HI when the counting value of said counter is smaller than the output value of said accumulator.

8. The driving circuit of speaker as set forth in claim 7, wherein the output of the second comparator is HI when the counting value of said counter is smaller than the output value of said first data group.

9. The driving circuit of speaker as set forth in claim 5, wherein the pulse height conversion circuit comprises:
    a plurality of AND gates, one input terminal of each of said AND gates being commonly connected to the output of said XOR gate, and the other input terminal of each of said AND gates being respectively connected to the second data group; and a plurality of current sources with different current ratios, controlled by the output of said AND gates and the output of the second comparator, the output of said current sources being commonly connected to said speaker.

10. A driving circuit of speaker for converting digital sound data into corresponding driving signals to drive said speaker, said digital sound data being divided into a higher bits data group and a lower bits data group, the driving circuit comprising:
  a pulse width modulation circuit being used to modulate said higher bits data group into driving signals represented by pulse width, the pulse width modulation circuit comprising:
    a counter;
    an accumulator having one input terminal connected to said higher bits data group;
    a first comparator for comparing the output of said counter with the output of said accumulator;
    a second comparator for comparing the output of the counter with the higher bits data group; and
    an XOR gate having two input terminals being connected to the outputs of said first comparator and the second comparator, respectively; and
  a pulse height conversion circuit being used to convert said lower bits data group into driving signals represented by pulse height.

11. The driving circuit of speaker as set forth in claim 10, wherein the counter starts counting from 0 at the beginning of every sound sampling cycle.

12. The driving circuit of speaker as set forth in claim 10, wherein the output of the first comparator is HI when the counting value of said counter is smaller than the output value of said accumulator.

13. The driving circuit of speaker as set forth in claim 12, wherein the output of the second comparator is HI when the counting value of said counter is smaller than the output value of said higher bit data group.

14. The driving circuit of speaker as set forth in claim 10, wherein the pulse height conversion circuit comprises:
  a plurality of AND gates, one input terminal of each of said AND gates being commonly connected to the output of said XOR gate, and the other input terminal of each of said AND gates being respectively connected to the lower bits data group; and
  a plurality of current sources with different current ratios, controlled by the output of said AND gates and the output of the second comparator, the output of said current sources being commonly connected to said speaker.

15. The driving method as set forth in claim 1, wherein said step of converting said second data group comprises:
  receiving a logic output signal obtained by said first driving signal and a comparator output signal, wherein said comparator output signal is obtained by comparing an added data group based on said first data group with a counting value which is used to determine the pulse width of said first driving signal; and
  converting said first input signal into said second driving signal according to said second data group and under the control of said second input signal, wherein said first input signal corresponds to said second data group and said second input signal corresponds to said logic output signal.

16. The driving method as set forth in claim 15, wherein said step of outputting a speaker driving signal comprises:
  obtaining an output signal whose pulse height corresponds to the pulse weight of said first driving signal; and
  outputting said speaker driving signal according to said second driving signal and said output signal.

17. The driving method as set forth in claim 16, wherein said first data group is higher bits data group and said second data group is lower bits data group.

18. The driving method as set forth in claim 1, wherein said step of converting said second data group comprises:
  obtaining an added data group based on said second data group;
  selecting one of said added data group and said second data group as said first input signal under the control of said second input signal, wherein said second input signal corresponds to said first driving signal; and
  converting said first input signal into said second driving signal according to said second data group.

19. The driving method as set forth in claim 18, wherein said step of outputting a speaker driving signal comprises:
  outputting said second driving signal as said speaker driving signal.

20. The driving method as set forth in claim 19, wherein said first data group is lower bits data group and said second data group is higher bits data group.

21. The driving circuit of speaker as set forth in claim 4, wherein the pulse height modulation circuit comprises:
  an accumulator for obtaining an added data group based on said second data group;
  a multiplexer for selecting one of said added data group and said second data group as said first input signal under the control of said second input signal, wherein said second input signal corresponds to said first driving signal; and
  a plurality of current sources with different current ratios, controlled by said first input signal, for converting said first input signal into said second driving signal according to said second data group, wherein said second driving signal is based on output of said current sources, wherein said speaker driving signal corresponds to said second driving signal.

22. A driving circuit for generating a plurality of driving signals according to a plurality of digital signals, each of the digital signals including a plurality of bits and representing one value, the driving circuit generating a first driving signal of the plurality of driving signals according to a first digital signal of the plurality of digital signals, the driving circuit comprising:
  a pulse height modulation circuit for generating a first part of the first driving signal according to the first digital signal;
  a pulse width modulation circuit for generating a second part of the first driving signal according to the first digital signal; and
  a node coupled to the pulse height modulation circuit and the pulse width modulation circuit for outputting the first driving signal according to the first and second parts of the first driving signal;
  wherein a waveform of the first part of the first driving signal is different from a waveform of the second part of the first driving signal in at least one of pulse height and pulse width such that a waveform of the first driving signal is discontinuous;
  wherein corresponding to a value represented by a plurality of bits of the first digital signal, the first driving signal has a waveform including:
    a first pulse whose pulse height according to the first part of the first driving signal; and
    a second pulse whose pulse width according to the second part of the first driving signal.

23. The driving circuit of claim 22, wherein the pulse height modulation circuit generates the first part of the first driving signal according to a first part of the plurality of bits of the first digital signal such that the pulse height of the first part of the first driving signal varies with the first part of the plurality of bits of the first digital signal.

24. The driving circuit of claim 23, wherein the pulse width modulation circuit generates the second part of the first driving signal according to a second part of the plurality of bits of the first digital signal such that the pulse width of the second part of the first driving signal varies with the second part of the plurality of bits of the first digital signal.

25. The driving circuit of claim 24, wherein the waveform of the first driving signal has a number of levels in pulse width which is determined by the second part of the plurality of bits of the first digital signal.

26. The driving circuit of claim 23, wherein the waveform of the first driving signal has a number of levels in pulse height which is determined by the first part of the plurality of bits of the first digital signal.

27. The driving circuit of claim 22, wherein the plurality of digital signals are digital sound data.

28. The driving circuit of claim 22, wherein the pulse height modulation circuit generates the first part of the first driving signal according to the first digital signal and under the control of an input signal based on the second part of the first driving signal.

29. The driving method as set forth in claim 1, wherein the speaker driving signal has a waveform, corresponding to said digital sound data, including: a first portion with a pulse width according to said first driving signal and a second portion with a pulse height according to the said second driving signal.

30. The driving circuit of speaker as set forth in claim 4, wherein the speaker driving signal has a waveform, corresponding to said digital sound data, including: a first portion with a pulse width according to said first driving signal and a second portion with a pulse height according to the said second driving signal.

31. A driving circuit for generating a plurality of driving signals according to a plurality of digital signals, each of the digital signals including a plurality of bits representing a value, the driving circuit generating a first driving signal of the plurality of driving signals according to a first digital signal of the plurality of digital signals, the driving circuit comprising:
   a pulse height modulation circuit for generating a first part of the first driving signal according to the first digital signal;
   a pulse width modulation circuit for generating a second part of the first driving signal according to the first digital signal; and
   a node coupled to the pulse height modulation circuit and the pulse width modulation circuit for outputting the first driving signal according to the first and second parts of the first driving signal;
   wherein a waveform of the first part of the first driving signal is different from a waveform of the second part of the first driving signal in at least one of pulse height and pulse width such that a waveform of the first driving signal is discontinuous;
   wherein corresponding to a value represented by a plurality of bits of the first digital signal, the first driving signal has a waveform including:
      a first pulse whose pulse width is related to a first part of the plurality of bits; and
      a second pulse whose pulse height is related to a second part of the plurality of bits.

32. A driving circuit for generating a plurality of driving signals according to a plurality of digital signals, each of the digital signals including a plurality of bits representing a value, the driving circuit generating a first driving signal of the plurality of driving signals according to a first digital signal of the plurality of digital signals, the driving circuit comprising:
   a pulse height modulation circuit for generating a first part of the first driving signal according to the first digital signal, the pulse height modulation circuit comprising:
      a plurality of current sources; and
      a plurality of switches, coupled the current sources and controlled according to the first digital signal selectively, for outputting the first part of the first driving signal according to the first digital signal;
   a pulse width modulation circuit for generating a second part of the first driving signal according to the first digital signal;
   a node, coupled to the pulse height modulation circuit and the pulse width modulation circuit, for outputting the first driving signal according to the first and second parts of the first driving signal; and
   wherein a waveform of the first part of the first driving signal is different from a waveform of the second part of the first driving signal in at least one of pulse height and pulse width such that a waveform of the first driving signal is discontinuous.

33. The driving circuit of claim 31, wherein the pulse height modulation circuit generates the first part of the first driving signal according to the first digital signal and under the control of an input signal based on the second part of the first driving signal.

* * * * *